(12) United States Patent
Akino

(10) Patent No.: US 6,453,048 B1
(45) Date of Patent: Sep. 17, 2002

(54) IMPEDANCE CONVERTER FOR A CONDENSER MICROPHONE

(75) Inventor: Hiroshi Akino, Sagamihara (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 0 days.

(21) Appl. No.: 09/299,851

(22) Filed: Apr. 26, 1999

(30) Foreign Application Priority Data

May 7, 1998 (JP) ............................................ 10-124399

(51) Int. Cl.[7] .............................. H04R 3/00; H03F 21/00
(52) U.S. Cl. ........................................ 381/113; 381/120
(58) Field of Search ................................. 381/111, 112, 381/113, 114, 115, 120, 174; 357/61; 330/296

(56) References Cited

U.S. PATENT DOCUMENTS

| | | | | |
|---|---|---|---|---|
| 4,491,697 A | * | 1/1985 | Tanaka et al. ............... | 381/113 |
| 4,629,910 A | * | 12/1986 | Early et al. .................. | 381/113 |
| 4,757,545 A | * | 7/1988 | Rosander ..................... | 381/113 |
| 5,489,876 A | * | 2/1996 | Pernici ........................ | 381/120 |
| 5,577,129 A | * | 11/1996 | Ehara .......................... | 381/120 |
| 5,579,397 A | * | 11/1996 | Ikeda et al. .................. | 381/120 |
| 5,861,779 A | * | 1/1999 | Loeppert et al. ............. | 381/120 |
| 6,104,818 A | * | 8/2000 | Korner ........................ | 381/113 |
| 6,160,450 A | * | 12/2000 | Eschauzier et al. ......... | 381/121 |

* cited by examiner

*Primary Examiner*—Xu Mei
(74) *Attorney, Agent, or Firm*—Welsh & Katz, Ltd.

(57) ABSTRACT

There is provided a preferable impedance converter for particularly to a condenser microphone having higher input impedance without being limited by a grid resistance, and suppressing the impedance converter including an amplifier tube 2 with plate-ground, and a bias circuit 1 for generating a bias voltage applied to a grid of the amplifier tube 2, said bias circuit 1 including a diode 1A for generating a bias voltage, and a diode 1B for applying the bias voltage to the grid and thereby flowing a current toward the grid of the amplifier tube 2 so that a ham noise and a variation of a bias can be suppressed.

5 Claims, 5 Drawing Sheets

IMPEDANCE CONVERTER FOR A CONDENSER MICROPHONE

FIELD OF THE INVENTION

The present invention relates to an impedance converter used for a condenser microphone, and more specifically, to an impedance converter for a condenser microphone, in which vacuum tubes such as a triode, an amplifier tube and so on are used for converting an impedance.

BACKGROUND OF THE INVENTION

In an impedance converter used for a condenser microphone, a voice signal input at a high impedance is output from a condenser microphone to an amplifier at a low impedance. Thereby, in a condenser microphone with a small value in a an effective electrostatic capacity, a frequency response at a low frequency band is obtained therefrom. Further, in such a kind of impedance converters, a vacuum tube is mainly used as amplification means for maintaining a suitable voice generated from a condenser microphone.

A conventional impedance converter as described above is shown in a circuit of FIG. 10, which was used for various condenser microphones. The circuit of FIG. 10 includes input terminals 141, 142, a bias circuit 110 provided therein with a gird resistance 111 connected in parallel with each other, a bias resistance 112 and a condenser 113, a vacuum tube for amplification (hereinafter called as an amplifier tube) 120, a load resistance 130, a power terminal 143, an output terminal 144, and a ground terminal 145.

A condenser microphone portion 100 includes a voice signal generating circuit 101 for generating a voice signal, and a condenser 102 which comprises a vibration plate (not shown) in which vibration is caused by sound applied thereto from outside thereof and a fixed electrode (not shown), and connected with input terminals 141 and 142 of an impedance converter. In the voice signal generating circuit 101, a voice voltage is generated, based on an electrostatic capacity corresponding to a change of distance between the vibration plate and the fixed electrode thereby a voice signal is produced. The voice signal produced by the voice signal generating circuit 101 is output to the impedance converter through the input terminal 141 and 142. The condenser 102 comprised of a vibration plate and an electrode has an electrostatic capacity of about 5 to 100 [pF].

The condenser microphone portion 100 is connected with the impedance converter through the input terminals 141 and 142, of which the input terminal 141 is connected with the amplifier tube 120, and of which the input terminal 142 is connected with the ground terminal 145 which is an earth.

In the amplifier tube 120, a vacuum tube for amplification is used for impedance conversion. That is, the amplifier tube 120 comprises a cathode connected with the power terminal 143, a grid connected with the input terminal 141, and a plate connected with the output terminal 144. In such a kind of the amplifier tube 120, a voice signal applied at a high impedance to the grid side is output to the plate side at a low impedance.

A power current Ip flows from the power terminal 143 to the cathode of the amplifier tube 120. When the plate side is an anode, the current flows inward from the grid side. When the plate side is cathode, the current flows from the plate side. Thus, the voice signal input into the impedance converter through the input terminal 141 from a condenser microphone is amplified by the amplifier tube 120 to be output from the plate side. That is, in the amplifier tube 120, when a voice signal is applied, the plate side is at ground so that it is operated as a cathode follower.

The bias circuit 112 is disposed between the grid and the plate in the amplifier tube 120, and comprises a grid resistance 111 and a bias resistance 112 connected in parallel therewith each other. The bias resistance 112 of the bias circuit 110 is connected in series with a load resistance 130, and connected with a grid/ground terminal 145 through the load resistance 130.

The flow of the current Ip to the amplifier tube 120 is lowered in voltage by the bias circuit. In the amplifier tube 120, the plate side is loaded through the bias resistance 112, and the grid side is loaded through the grid resistance 111. An AC component of the power current Ip from the plate side of the amplifier tube 120 is bypassed by the condenser 113.

In the impedance converter with the triode as described above, a voice signal applied to the amplifier tube 120 from the condenser microphone portion 100 is not applied to the grid at the input impedance enough to a bias voltage, since the applied voice signal is affected from the grid resistance 111. As a result, a sufficient signal can not be taken out of the plate side.

When a voice signal is output from the plate of the amplifier tube 120 at a low impedance, a mutual conductance between the cathode and the grid of the amplifier tube 120 has to be increased for the purpose of solving the aforementioned problem. Because the output impedance is 1/mutual conductance and depends on the value of the mutual conductance. Therefore, a vacuum tube with a high mutual conductance value has to be selected as the amplifier tube 120. It is known that when the grid and the plate are spaced at a short distance, the mutual conductance value of the vacuum tube is increased. However, when the spacing between the grid and the plate is at a short distance, free electrons are liberated from the grid so that it tends to cause a flow of much leaky current, and makes the amplifier tube to be operated unstably. Firstly, this problem needs to be solved.

On the other hand, when the resistance value of the grid resistance 111 is increased, the voice signal can be applied to the grid of the amplifier tube 120 at a higher impedance than that of the previous one. However, the grid resistance 111 causes a change in bias voltage of the amplifier tube, since voltages on both ends of the grid resistance are increased. Therefore, it results in making the amplifier tube to be operated unstably.

Further, in the amplifier tube 120 used as a cathode follower, there is a problem in that residual electrons in a heater for heating a cathode are electrostatically coupled and output as a ham noise together with a voice signal.

SUMMARY OF THE INVENTION

In view of the above-described problems, an object of the present invention is to provide an impedance converter for a condenser microphone, in which an input voice signal from a condenser microphone portion through an input terminal can be impressed at a sufficient impedance to a grid of an amplifier tube with a high mutual conductance and a sufficient voice signal can be taken out of a plate without a ham noise affected from a cathode.

In order to achieve the aforementioned object, there is provided an impedance converter for a condenser microphone having an input terminal into which a voice voltage signal is input from outside, an amplifier tube which comprises a cathode, a grid and a plate for amplifying said voice voltage to output it to outside therefrom, the amplifier tube being plate-grounded, a power terminal for supplying power to a cathode of said amplifier tube, a bias circuit for applying a bias voltage to a grid of said amplifier tube, a condenser connected with a plate of said amplifier tube, a load resistance connected in series with said condenser, an output terminal for outputting a voice signal amplified by said amplifier tube, and a ground terminal connected in series with said load resistance, characterized in that said bias circuit includes a first diode for loading a flow of a current from a grid of said amplifier tube at a bias voltage, a second diode connected in inversely parallel with said first diode for effecting a rectifying action so that a flow of a current from said first diode flows to the grid, and a bias resistance disposed between said amplifier tube and said load resistance and connected in parallel with said second diode and said condenser to load a flow of current from a plate of said amplifier tube at a bias voltage.

Furthermore, in order to achieve the aforementioned object, there is provided an impedance converter for a condenser microphone having an amplifier tube which comprises an input terminal into which a voice signal is input from outside, a cathode, a grid and a plate for amplifying said voice signal to output it to outside, said amplifier tube with the plate side connected with earth, a power terminal for supplying power to a cathode of said amplifier tube, a bias circuit for applying a bias voltage to a grid of said amplifier tube, a condenser connected with a plate of said amplifier tube, a load resistance connected in series with said condenser, an output terminal for outputting a voice signal amplified by said amplifier tube, and a ground terminal connected in series with said load resistance, characterized in that said bias circuit includes a first diode for loading a flow of the current from a grid of said amplifier tube at a bias voltage, a second diode connected in inversely parallel with said first diode for effecting a rectifying action so that the flow of the current from said first diode flows to the grid, and a third diode disposed between said amplifier tube and said load resistance and connected in parallel with said second diode and said condenser to load a flow of the current from the plate of said amplifier tube at a bias voltage.

In addition, the present invention provides an impedance converter having an amplifier tube with a plate side connected with earth, and a bias circuit for generating a bias voltage applied to a grid of the amplifier tube, said impedance converter further including a resistance for applying a voice voltage to a current flowing from a power terminal when a voice signal is input to a grid of said amplifier tube, said voice voltage being applied to the grid side, a second amplifier tube for applying a voice voltage from a plate to a condenser connected with the amplifier tube with the plate connected with the earth, and a load resistance for applying a voice voltage to a cathode of said second amplifier tube.

Furthermore, the present invention provides an impedance converter having an amplifier tube with the plate-ground, and a bias circuit for generating a bias voltage applied to a grid of the amplifier tube, said impedance converter further including a resistance for applying a voice voltage to a flow of the current from a power terminal when a voice signal is input to a grid of said amplifier tube, said voice voltage being applied to the grid side, a second amplifier tube for applying a voice voltage from a plate to a condenser connected to the amplifier tube with the plate-ground, a load resistance for applying a voice voltage to a cathode of said second amplifier tube, two heaters for heating the cathodes of the amplifier tube with plate-ground and the second amplifier tube, respectively, and an electric double layer condenser for overcoming noises generated from said heaters.

Preferably, in the present invention, an input voltage applied to the amplifier tube is a voice voltage from a condenser microphone.

According to the present invention, a bias voltage is applied to a grid of the amplifier tube through the first diode and the second diode connected in parallel with the first diode. These two diodes make a voltage of the grid to be converged upon a bias voltage. At that time, the two diodes provides an operation with high resistivity, since no current flows into the two diodes. As a result, higher impedance than the prior art can be obtained.

Further, a voltage generated in the third diode connected between the plate and the load resistance is a bias voltage applied to the amplifier tube. Thus, the generated voltage is substantially constant, when the current flows, and thereby a bias voltage can be maintained in a constant level.

Moreover, an electric double layer condenser with a large electrostatic capacity is connected in parallel with a heater so that the an influence of the noises generated from the heater can be eliminated from a cathode of the amplifier.

DESCRIPTION OF THE PREFERRED EMBODIMENTS

Figure 1:
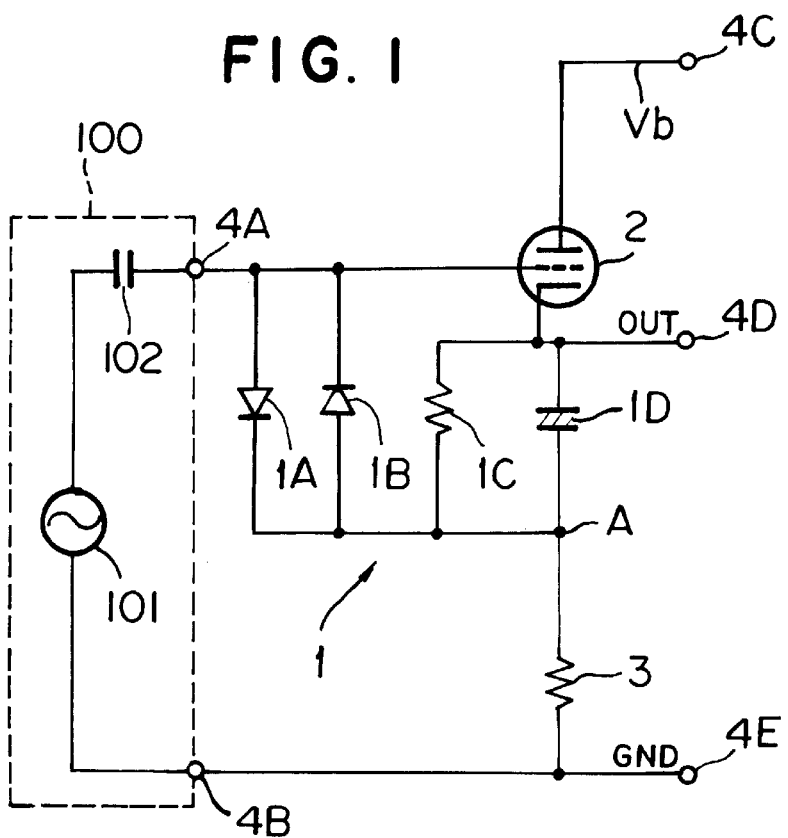
FIG. 1 is a block diagram showing an impedance converter for a microphone according to a first embodiment of the present invention.
Figure 10:
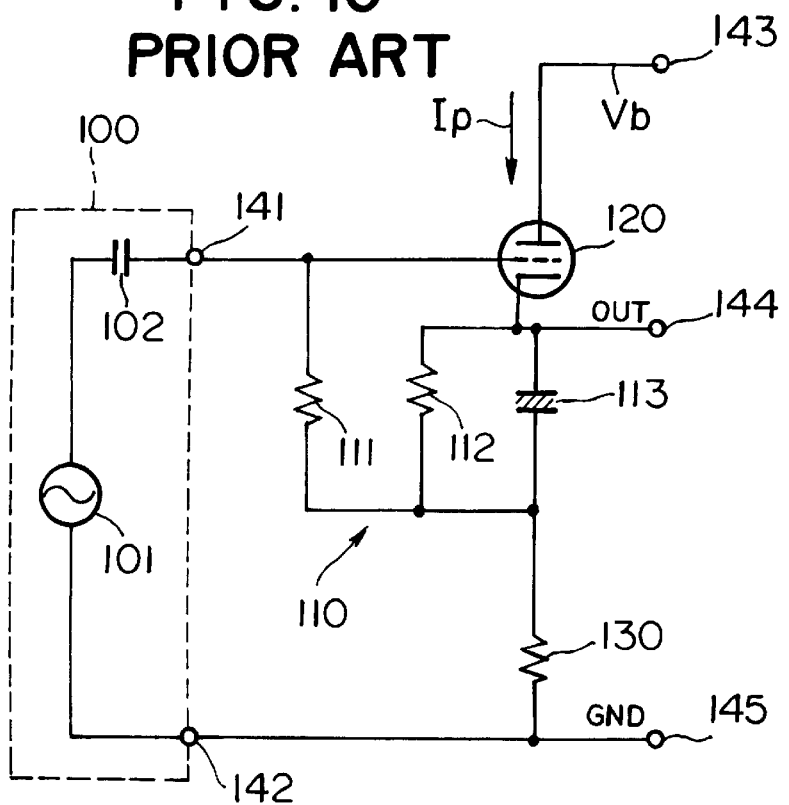
FIG. 10 is a block diagram showing a conventional impedance converter.

The concrete embodiments according to the present invention will be explained with reference to the drawings. Referring to FIG. 1 showing one embodiment, an impedance converter comprises a bias circuit 1, an amplifier tube 2, a load resistance 3, input terminals 4A, 4B, a power terminal 4C, an output terminal 4D, and a ground terminal 4E. The bias circuit 1 includes diodes 1A, 1B, a bias resistance 1C, and a condenser 1D. The load resistance 3 and the terminals 4A to 4E have the same function as that of the load resistance 130 and the terminals 141 to 145 shown in FIG. 10 explained previously. Also in the impedance converter according to the present invention, a voice signal is input at high impedance relative to a bias voltage from a voice signal generating circuit of a microphone portion. An output voice signal from a microphone portion 100 is input into a grid of a triode through the bias circuit 1.

The bias circuit 1 has one end connected to a plate of the amplifier tube 2 and the other end connected to a grid thereof. The diode 1A is disposed between the grid and the plate of the amplifier tube 2, the diode 1B is disposed in parallel inversely between the diode 1A and the plate of the amplifier tube 2, and the bias resistance 1C is disposed in parallel with the diodes 1A and 1B. Thereby, an inward flow of the current from the grid of the amplifier tube is output at a bias voltage. The condenser 1D is disposed on the plate side of the amplifier tube 2, and the load resistance 3 is connected with the bias resistance 1C and the condenser 1D. Accordingly, the inward flow of the current at the bias voltage is again output from the input terminal 4B via the condenser microphone portion, and returns to the impedance converter, at the time of which the current is output to the ground 4E.

The amplifier tube 2 is an amplifier tube with mutual conductance of 12500 [$\mu$MHO], which includes a high conductance applied to a grid resistance of 1 [M$\Omega$]. The amplifier tube is used as a cathode follower similarly to the amplifier tube 120 shown in FIG. 1. That is, as described above, the input voice signal from the condenser microphone portion 100 through the input terminal 4A flows into the cathode plate from the grid of the amplifier tube 2, and is amplified and taken out of the cathode plate.

Preferably, the diodes 1A and 1B used therein are diodes having a small amount of an inverse current and a junction capacity of, for example, 5 [pA] and 1.2 [pF].

Figure 3:
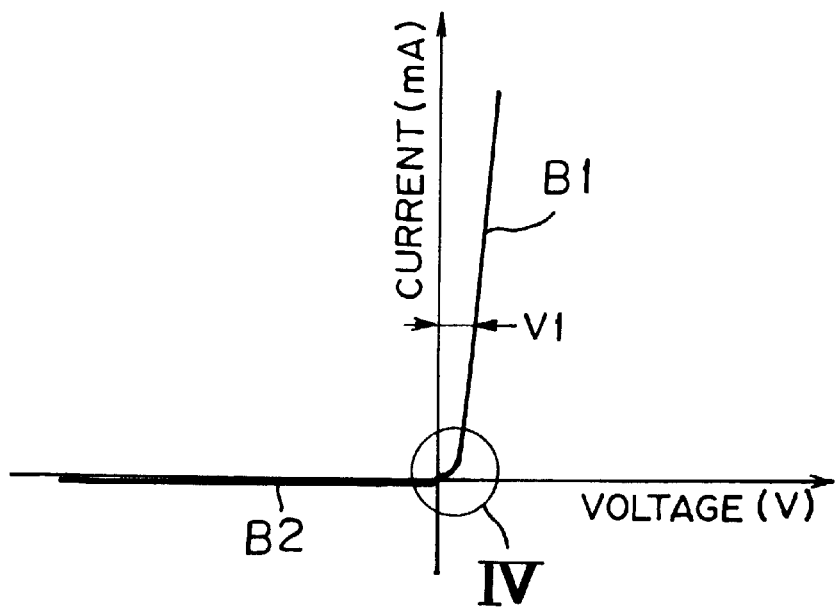
FIG. 3 is a voltage/current characteristic view showing the diode characteristics used in the first embodiment.
Figure 4:
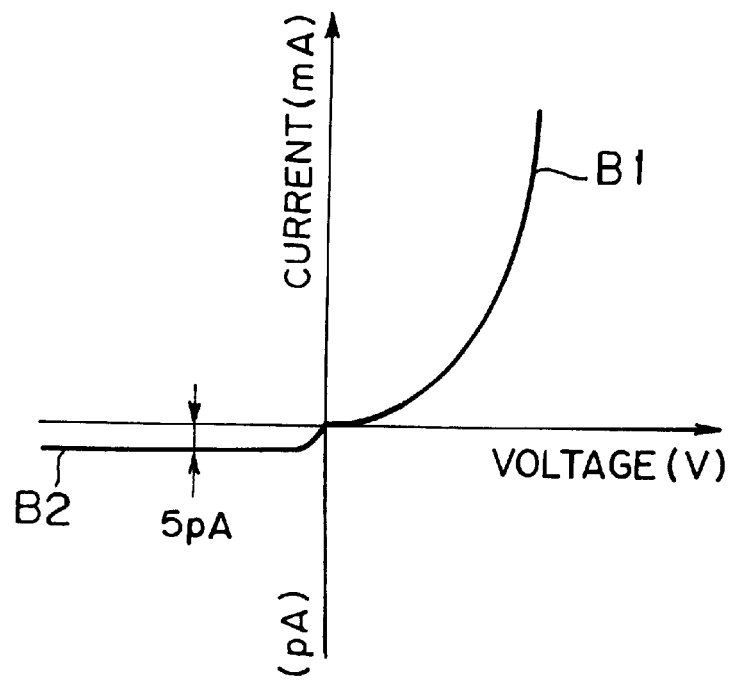
FIG. 4 is an enlarged view showing the diode characteristics used in the first embodiment.

The diode 1A is a silicon diode in which a drop of a voltage is caused, when a current flows forward. It is known that the diode has the voltage/current characteristics as shown by the bold line in FIG. 3. Referring to B1 and B2 in FIG. 3, the diode has the characteristics such that when a voltage in the forward direction is applied, the current flows, and even if a voltage in the inverse direction is applied, the current does not flow. However, in the case of the silicon diode, when a voltage in the inverse direction is applied thereby the voltage is increased, the current rapidly flows, as shown in FIG. 4. This current sustains about 5 pA. In addition, the forward voltage is lowered so that a current flows at constant voltage. In the case of a silicon diode used for the diode 1A, when a forward voltage is applied, the voltage is lowered to about 0.7 V.

Further, as explained above, since the amplifier tube 2 is a vacuum tube with a high mutual conductance, a problem is often caused such that free electrons are liberated out of a grid and a bias voltage is risen over a grip voltage.

Figure 2:
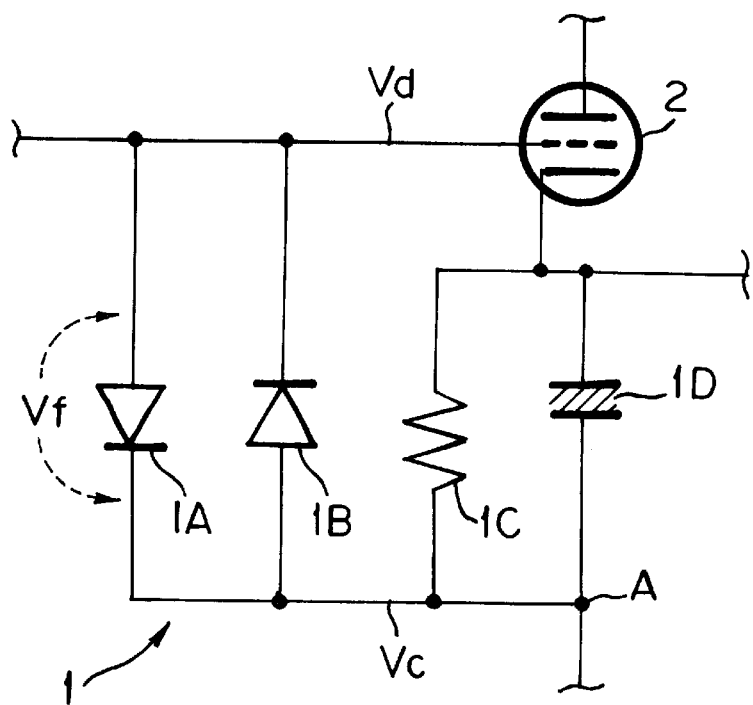
FIG. 2 is an explanatory view for explaining operation of a bias circuit in the first embodiment.

Referring to FIG. 2, a diode 1A has an anode side connected with a grid side of an amplifier tube and a cathode side connected with a plate side of the amplifier tube. Therefore, when free electrons are liberated out of a grid, and the inward flow of the current at a bias voltage flows in a higher voltage than a voltage of a voice signal, the inward voltage flows into the diode 1A. hat is, when the inward flow of the current at a higher bias voltage than a grid voltage (a reference voltage of a voice signal) flows into the diode 1A, the current flows forward.

For example, when the bias voltage is higher than the grid voltage, the inward current flows into the diode 1A from the grid side. As shown in FIG. 2, when a generated bias voltage at a junction point A is a voltage Vc, the grid voltage is a voltage Vd. As described above, since the diode 1A is a silicon diode, when a current flows, a voltage drop is caused. In this circuit, a voltage drop Vf is caused at the value more or less about 0.7 V. With this voltage drop, the bias voltage Vc is lower at a voltage drop portion Vf with respect to the grid voltage Vd.

As will be understood from FIG. 4, the diode 1A continues the operation of suppressing a variation of such a grid voltage Vd relative to the bias voltage V till zero at which the current does not flow to the anode. Further, the flow of current from the diode 1A flows into a diode 1B by the forward current/voltage characteristics B1 of the diode shown in FIG. 3.

This current flows out of the diode 1B as a forward current, and joins with a flowing current at a grid voltage. An inverse flow of the current from the diode 1A at that time joins with a bias voltage and is output to ground via the condenser microphone portion. Further, an inverse flow of the current from the diode 1B is stored in a battery 1D with a load of a bias voltage applied by a resistance 1C. Accordingly, the bias voltage Vc is lowered and the value of the grid voltage Vc becomes larger than the bias voltage again, and therefore, a variation portion of the grid voltage Vd relative to the bias voltage Vc is suppressed. Thereby, a sufficient voice signal can be taken out of the plate of the amplifier tube 2 at a low impedance.

Further, when the grid voltage Vd is higher than the bias voltage Vc, a current flows also to the diode 1A as a inverse current, but flows to the diode 1B, is converged by a flow of a current to the grid and returns. The current is also stored in the condenser 1D. This converging action is instantaneously operated. Accordingly, the voice signal can be applied to the grid at a high impedance.

In this manner, according to the present invention, the diodes 1A and 1B are used in place of the bias resistance used in prior art whereby even if an amplifier tube having high mutual conductance between electrodes is used, an input impedance restricted by the bias resistance 11 can be made high.

Figure 5:
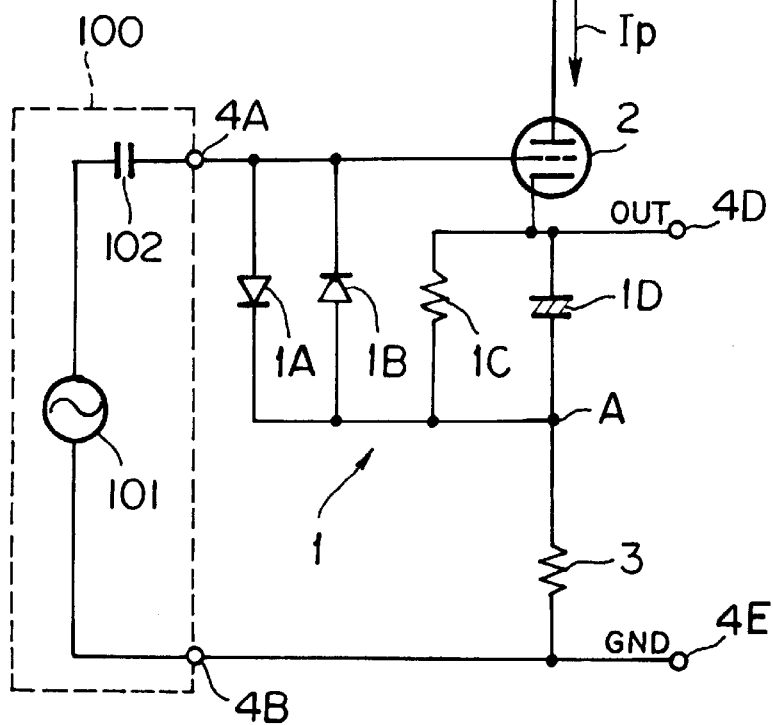
FIG. 5 is a block diagram showing an impedance converter for a microphone according to a second embodiment of the present invention.

Next, a second embodiment shown in FIG. 5 is explained. Referring to FIG. 5, in this impedance converter, a diode 1E is used in place of the bias resistance 1c in the bias circuit 1 shown in FIG. 1. Other constitutional elements can be identical with or regarded to be identical with the impedance converter for a condenser microphone shown in FIG. 1 explained previously. A description of these constitutional elements is omitted, and the same reference numerals as those used previously are used.

In this bias circuit 1, a diode 1E used in place of the bias resistance 1C is a silicon diode. An anode of the diode 1E is connected to a plate of an amplifier tube 2, and a cathode of the diode 1E is connected with the middle of a circuit for connecting a diode 1B connected in inversely parallel with a junction point A of a condenser 1D.

A diode 1E loads a current on the plate side of the amplifier tube 2 at a bias voltage. That is, a plate current Ip of the amplifier tube 2 flows from the plate to the diode 1E whereby the diode 1E causes a voltage drop. This voltage drop is a substantially constant value as compared with the voltage drop by the bias resistance 1C. Thereby, the bias voltage is lowered.

A flow of a current from the diode 1E is stored in the condenser 1D and flows into the grid through the diode 1B. As a result, even if the value of the plate current Ip is different due to the unevenness of the amplifier tube 2, the voltage drop caused by the diode 1E is substantially stable, and therefore, the effect of the unevenness of the amplifier tube 2 can be avoided. Further, since the grid voltage of the amplifier tube 2 is made to be maintained in substantially constant level through the diode 1E, the plate current Ip of the amplifier tube 2 can be stabilized.

Figure 6:
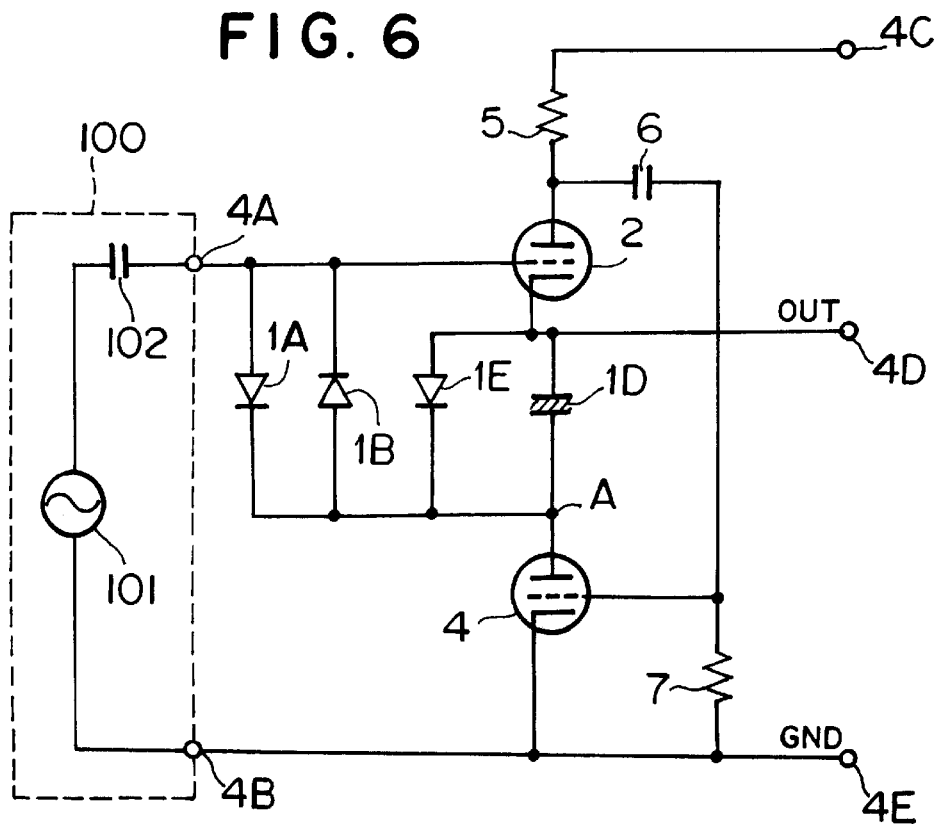
FIG. 6 is a block diagram showing an impedance converter for a microphone according to a third embodiment of the present invention.

Next, a third embodiment shown in FIG. 6 will be explained. Referring to FIG. 6, in this impedance converter, a constant current load circuit is used in place of the load resistance 3 used in FIGS. 1 and 5. Other constitutional elements may be identical with or regarded to be identical with the impedance converter for a condenser microphone shown in FIG. 1 and 5 explained previously. A description of these constitutional elements is omitted, and the same reference numerals as those used previously are used.

In an impedance converter shown in FIG. 6, there is disposed a constant current circuit which comprises a resistance 7 connected in series with a power terminal 4C through a condenser 6 and an amplifier tube 4 connected in parallel with the resistance 7 between a condenser 1D and a ground 4E. Further, a resistance 5 is disposed between the power terminal 4C and a cathode of the amplifier tube 2, the resistance having a small value at which includes a load level at a voice voltage applied to a current flowing from the power terminal 4C.

A description will be given while referring to FIG. 6. A flow of the current from the power terminal 4C is loaded at a voice voltage through the resistance 5. The voice voltage is applied to the cathode of the amplifier tube 2, and is applied as a grid voltage to a grid of an amplifier tube 4 through the condenser 6. A bias voltage output from the grid of the amplifier tube 2 is applied to a cathode of the amplifier tube 4. The flows of current to both the grid and the cathode of the amplifier tube 4 are flown at a constant voltage through the resistance C. The flow of current from the plate of the amplifier 4 is stored in the condenser 1E. Thereby, a noise generated in the amplifier tube 2 is suppressed, and the grid and the cathode of the triode 4 are always maintained to the same potential therebetween. As a result, a distortion of a voice signal can be improved over the first and second embodiments.

Figure 7:
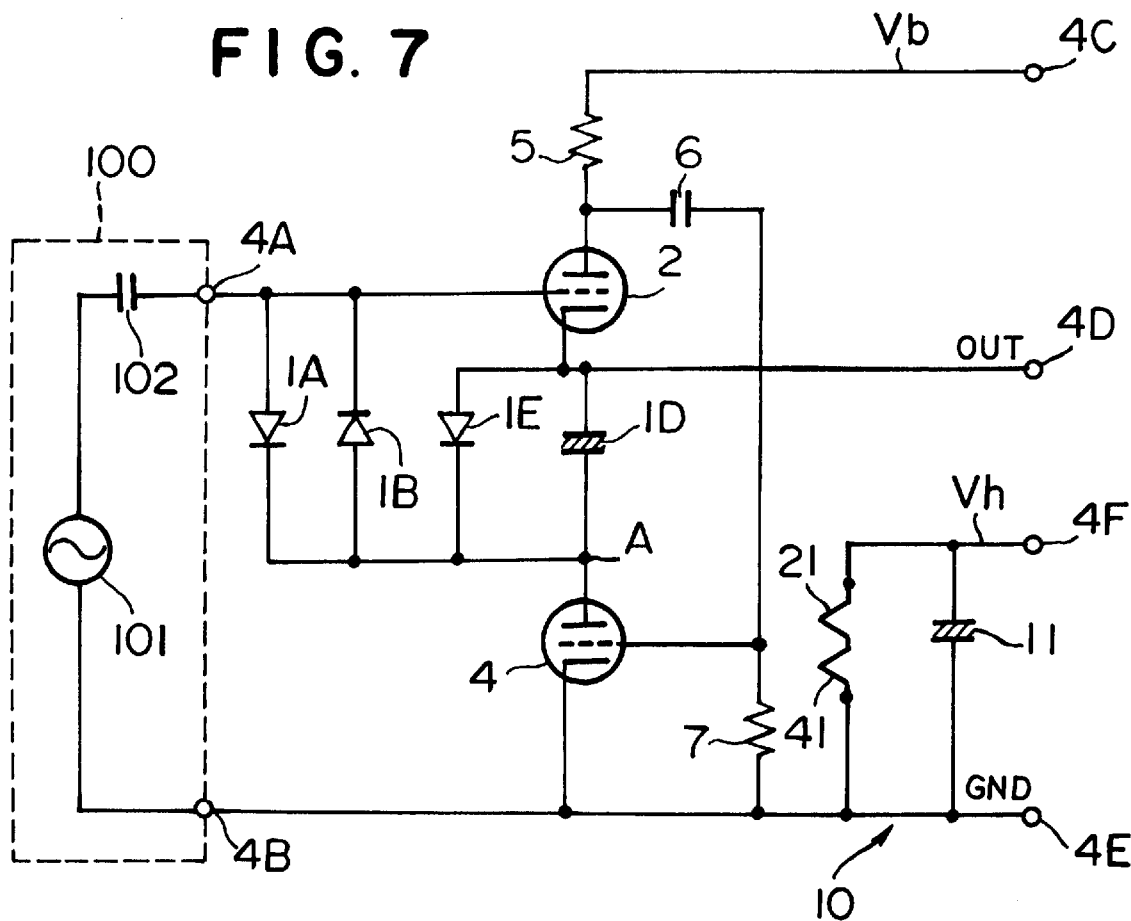
FIG. 7 is a block diagram showing an impedance converter for a microphone according to a fourth embodiment of the present invention.
Figure 8:
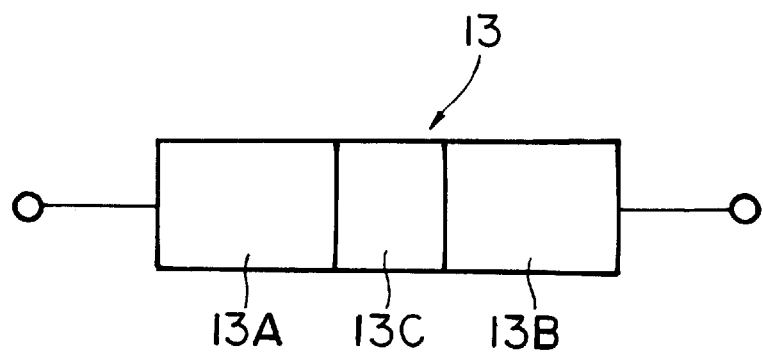
FIG. 8 is an explanatory view for explaining an electric double layer condenser in the above-described embodiment.

A fourth embodiment will be explained hereinafter in reference to further improvement of the third embodiment. Referring to FIG. 7, in this impedance converter, a diode 1E is used in place of the bias resistance 1C in the bias circuit 1 of FIG. 1. Other constitutional elements can be identical with or regarded to be identical with the impedance converter for a condenser microphone shown in FIG. 1 explained previously. A description of these constitutional elements is omitted, and the same reference numerals as those used previously are used.

This impedance converter includes a heater circuit 10 for heating cathodes of the amplifier tubes 2 and 4. The heater circuit 10 comprises heaters 21 and 41 for heating a cathode of the amplifier tube 2 and a cathode of the amplifier tube 4, respectively, the heater 41 being connected in series with the heater 21, and a condenser 11 connected in parallel with the heaters 21 and 41, the respective constitutional elements being connected in series with a ground 4E.

The heaters 21 and 41 for heating the cathodes of the amplifier tubes are provided closer to the cathodes of the amplifier tubes 2 and 4 so that heat is easily transmitted to the amplifier tubes. Thereby, electrostatic powers are generated between the heaters 21, 41 and the amplifier tubes 2, 4, respectively, to make the heaters to be electrostatically coupled with the amplifier tubes so that the current flows from the cathode to the plate. However, there is a problem in that the effect of the electrostatic power (hereinafter referred to as a heater noise) on a voice voltage output from an output terminal 4D occurs.

The condenser 11 is provided in parallel with the heaters 21 and 41 in consideration of the problem. For this condenser, an electric double layer condenser is used, which comprises activated carbon electrodes 13A, 13B provided on the anode side and the cathode side, respectively, and an electrolyte 13C provided between the two activated carbon electrodes. The electric double layer condenser with the activated carbon electrodes 13A, 13B has a large electrostatic capacity as compared with an electrolytic condenser, the activated carbon electrodes having a large surface area on the anode side and the cathode side, respectively.

The heater noise is generated under the effect of an operating resistance of the heaters 21, 41, a heat noise caused by heating at high temperature, and an irregular electron emission. For example, if the heaters 21, 41 has a cathode made of oxides, the operating resistance of the heaters 21, 42 is 21 [Ω],and the heating temperature is from 980 to 1200 [K].

The condenser 11 with a large capacity makes AC short circuit of the heaters 21, 41 in which the heater noise is generated. Thereby, the heater noise can be avoided through the condenser 11.

When the impedance converter according to the fourth embodiment was used under the conditions as described below, preferable values were shown. A condenser 102 used for a condenser microphone portion 100 has an electrostatic capacity of 65 [pF], wherein B power source has the DC voltage of 120 [V] and the consuming current of Vb 8 [mA], and A power source has a heater voltage of 6.3 [V] and a consuming current Vh of 0.3 [A]. Then the following are represented:

Maximum output level: 26 [dBV]
(THD) 1 percent, 1 [kHz])
Residual noise: −112[dBV] (A-WEIGHT)
Output impedance: 160 [Ω]
Passage loss: −1 [dB]

When a reference output level is −33 [dBV], the characteristics of Embodiment 4 are as follows:

Head margin: 59 [dB]
S/N ratio: 79 [dB]
Dynamic range: 138 [dB]

Figure 9:
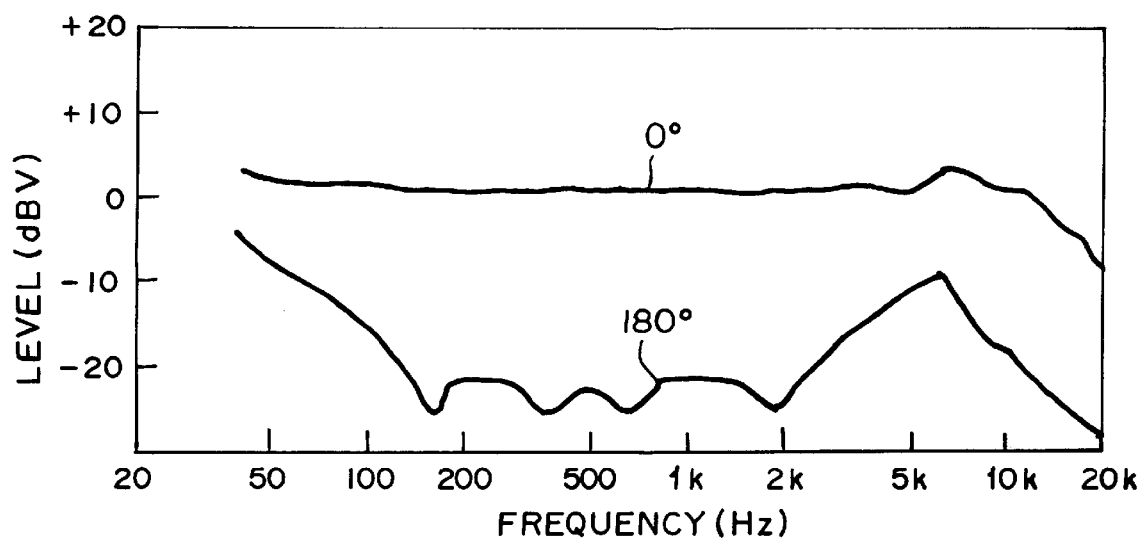
FIG. 9 is a characteristic view showing the frequency response in the above-described embodiment.

When an actual microphone is connected in Embodiment 4, the characteristics are as follows:

Frequency response: 20 to 20 [kHz]
Sensitivity: −33 [dB/Pa] (1[kHz])
Output impedance: 200 [Ω]
S/N ratio: 76 [dB] (A-WEIGHT)
Maximum allowable input sound pressure level: 150 [dB] (THD) 1 percent, 1 [kHz])
Dynamic range: 132 [db] or more The frequency response characteristics according to the directivity of 0 degree and 180 degrees in Embodiment 4 are shown in FIG. 9. Consequently, according to the figure, it is found in Embodiment 4 that a sufficiently high input impedance and a small input capacity is provided, as clearly shown that the response frequency extends to a low region and that the passage loss is small.

Finally, in comparison with impedance converters from other companies, A to F, the performance of Embodiment 4 is represented in following Table 1.

As shown in Table 1, Embodiment 4 has an excellent dynamic range as compared with other impedance converters.

The description of Embodiments 1 to 4 in the present invention has been given as mentioned above, while the present invention may be limited thereto. For example, in the above embodiments, a single diode is used as the diodes 1A, 1B and 1E, while a plurality of diodes connected in series may be used as a single diode.

Particularly, a plurality of diodes connected in series to each other may be used as the diode 1E in which a necessary bias voltage is obtained. Likewise, a plurality of electric double layer condensers connected in parallel may be used as the condenser 11, if necessary.

As described above, according to the present invention, when a bias voltage is provided by two diodes connected to a grid of an amplifier tube, no current flows to the two diodes. As a result, a considerable change of a circuit is not required, and an input impedance can be made high as compared with prior art.

Further, since a voltage drop generated in the third diode is a bias voltage, the bias voltage can be maintained constant. As a result, by merely replacing a conventional cathode resistance with a diode, even if a plate current becomes uneven state due to a difference between amplifier tubes, it is possible to prevent a change of a bias voltage.

Furthermore, since an electric double layer condenser having a large electrostatic capacity is connected in parallel with a heater, a ham noise generated in a cathode of an amplifier tube caused by a heater can be short-circuited to remove the ham noise.

2. An impedance converter for a condenser microphone according to claim 1, wherein said bias circuit further includes a bias resistance connected between said amplifier tube and said load resistance; and connected in parallel with said second diode and said condenser for loading a flow of current flowing from a plate of said amplifier tube at a bias voltage.

3. An impedance converter for a condenser microphone having an input terminal into which a voice signal is input from outside; an amplifier tube with plate-ground for amplifying said voice signal to output it to outside, the amplifier tube comprising a cathode, a grid and a plate; a power terminal for supplying power to a cathode of said amplifier tube; a bias circuit for applying a bias voltage to a grid of said amplifier tube; a condenser connected to a plate of said amplifier tube; a load resistance connected in series with said condenser; an output terminal for outputting a voice signal amplified by said amplifier tube; and a ground terminal connected in series with said load resistance; characterized in that said bias circuit includes a first diode for loading a flow of a current from a grid of said amplifier tube at bias voltage;

a second diode connected in inversely parallel with said first diode for rectifying a flow of current from said first diode to make the current to be flown to the grid; and

TABLE 1

| Manufacturer | Company A | | Company B | Company C | Company D | Company E | Company F | Our company | |
|---|---|---|---|---|---|---|---|---|---|
| | Model I | Model II | | | | | | Designated Spec | Average Observation |
| Directivity | C, O, B | C | C, O, B | C | 5-PATTERNS | 9-PATTERNS | C, O | C | C |
| Sensitivity (dB/Pa) | −40 | −34 | −32 | −34 | −27 | −38 | −28 | −31 | −33 |
| Noise Level (dB S.P.L.) | 22 | 20 | 13 | 28 | 13 | 32 | 18 | 18 | 13.8 |
| S/N (dB) | 72 | 74 | 81 | 66 | 81 | 62 | 76 | 76 | 80 |
| Dynamic Range (dB) | 106 | 110 | 116 | 104 | 101 | 98 | 113 | 132 | 138.8 |
| Maximum allowable Input (dB S.P.L.) | 128 | 130 | 129 | 132 | 114 | 130 | 131 | 150 | 152.5 |
| T.H.D. (%) | 0.5 | 3 | 0.5 | 1 | 0.5 | | 1 | 1 | 1 |

What is claimed is:

1. An impedance converter for a condenser microphone having an input terminal for inputting a voice signal from outside; an amplifier tube with plate-ground for amplifying said voice signal to output it therefrom to outside, the amplifier tube comprising a cathode, a grid and a plate; a power terminal for supplying power to a cathode of said amplifier tube; a bias circuit for applying a bias voltage to a grid of said amplifier tube; a condenser connected to a plate of said amplifier tube, a load resistance connected in series with said condenser; an output terminal for outputting a voice signal amplified by said amplifier tube; and a ground terminal connected in series with said load resistance; characterized in that said bias circuit includes a first diode for loading a flow of a current from a grid of said amplifier tube at a bias voltage;

a second diode connected in inversely parallel with said first diode for rectifying a flow of current from said first diode to make the current to be flown to the grid; and a bias resistance connected between said amplifier tube and said load resistance and connected in parallel with said second diode and said condenser for loading a flow of a current from a plate of said amplifier tube at a bias voltage.

a third diode disposed between said amplifier tube and said load resistance and connected in parallel with said second diode and said condenser for loading a flow of a current from a plate of said amplifier tube at a bias voltage.

4. An impedance converter for a condenser microphone according to claim 3, said impedance converter for a condenser microphone further including a load resistance connected with said power terminal for producing a voice voltage;

a constant current circuit having a second amplifier tube having plate side loaded at a voice voltage through said load resistance, and the grid side for outputting the voice voltage therefrom to a condenser connected with a plate of said amplifier tube; and a load resistance for applying a voice voltage to a grid and a cathode of said second amplifier tube.

5. An impedance converter for a condenser microphone according to claim 3, said impedance converter further including a load resistance connected to said power terminal for generating a voice voltage;

a constant current circuit having a second amplifier tube having plate side loaded at a voice voltage through said load resistance, and the grid side for outputting the voice voltage therefrom to a condenser connected with a plate of said amplifier tube, and a load resistance for applying a voice voltage to a grid;

heater means for heating said two amplifier tubes; and an electric double layer condenser connected in parallel with said heating means for removing noises generated in said amplifier tube by said heater means.

* * * * *